United States Patent
Cappelletti et al.

(10) Patent No.: US 7,320,904 B2
(45) Date of Patent: *Jan. 22, 2008

(54) MANUFACTURING METHOD FOR NON-ACTIVE ELECTRICALLY STRUCTURES IN ORDER TO OPTIMIZE THE DEFINITION OF ACTIVE ELECTRICALLY STRUCTURES IN AN ELECTRONIC CIRCUIT INTEGRATED ON A SEMICONDUCTOR SUBSTRATE AND CORRESPONDING CIRCUIT

(75) Inventors: Paolo Giuseppe Cappelletti, Seveso (IT); Alfonso Maurelli, Sulbiate (IT); Paola Zabberoni, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 57 days.

This patent is subject to a terminal disclaimer.

(21) Appl. No.: 11/334,988

(22) Filed: Jan. 19, 2006

(65) Prior Publication Data

US 2006/0189136 A1 Aug. 24, 2006

Related U.S. Application Data

(62) Division of application No. 10/911,220, filed on Aug. 3, 2004, now Pat. No. 7,001,800.

(30) Foreign Application Priority Data

Aug. 4, 2003 (EP) .................................. 03425532

(51) Int. Cl.
H01L 21/82 (2006.01)
H01L 29/76 (2006.01)

(52) U.S. Cl. ...................................... 438/129; 257/368

(58) Field of Classification Search ................ 257/265, 257/334, 368, 476, E29.255–E29.313, E29.315–E29.316; 438/128–129, 599, 926

See application file for complete search history.

(56) References Cited

U.S. PATENT DOCUMENTS

| 5,885,856 | A | 3/1999 | Gilbert et al. | 438/129 |
|---|---|---|---|---|
| 6,262,435 | B1 | 7/2001 | Plat et al. | 257/48 |
| 6,384,464 | B1 | 5/2002 | Shin | 257/503 |
| 6,448,630 | B1 | 9/2002 | Komori | 257/625 |
| 6,521,969 | B1 | 2/2003 | Tomita | 257/510 |
| 2001/0004122 | A1 | 6/2001 | Ito | 257/368 |
| 2002/0061608 | A1 | 5/2002 | Kuroda et al. | 438/129 |

FOREIGN PATENT DOCUMENTS

WO 03/019641 3/2003

*Primary Examiner*—Calvin Lee
(74) *Attorney, Agent, or Firm*—Lisa K. Jorgenson; Allen, Dyer, Doppelt, Milbrath & Gilchrist, P.A.

(57) ABSTRACT

A method for manufacturing electrically non-active structures for an electronic circuit integrated on a semiconductor substrate is provided, with the electronic circuit including first and second electrically active structures. The method includes inserting the electrically non-active structures in the electronic circuit to make uniform a surface above the semiconductor substrate. The inserting includes identifying, among the electrically non-active structures, a first group of electrically non-active structures to be adjacent the first and second electrically active structures, and identifying, among the electrically non-active structures, a second group of electrically non-active structures not adjacent to the first and second electrically active structures. The method further includes defining, on the semiconductor substrate, the first and second groups of electrically non-active structures through different photolithographic steps.

14 Claims, 3 Drawing Sheets

MANUFACTURING METHOD FOR NON-ACTIVE ELECTRICALLY STRUCTURES IN ORDER TO OPTIMIZE THE DEFINITION OF ACTIVE ELECTRICALLY STRUCTURES IN AN ELECTRONIC CIRCUIT INTEGRATED ON A SEMICONDUCTOR SUBSTRATE AND CORRESPONDING CIRCUIT

CROSS-REFERENCE TO RELATED APPLICATION

This is a divisional patent application of U.S. patent application Ser. No. 10/911,220, filed Aug. 3, 2004 and issued as U.S. Pat. No. 7,001,800, which is hereby incorporated by reference in their entirety for all purposes.

FIELD OF THE INVENTION

The present invention relates to a method for manufacturing electrically non-active structures to optimize the definition of electrically active structures in an electronic circuit integrated on a semiconductor substrate and corresponding circuit.

The invention particularly, but not exclusively, relates to a method for defining electrically non-active structures to optimize the definition of electrically active structures, such as non-volatile memory cells, and the following description is made with reference to this field of application for convenience of illustration only.

BACKGROUND OF THE INVENTION

When designing electronic circuits manufactured in submicrometric CMOS technologies and integrated on a semiconductor substrate, the insertion of electrically non-active service structures is becoming more necessary. These structures are commonly defined as dummy structures. Dummy structures provide an improved definition during the manufacturing process of the electrically active components of an integrated circuit.

Dummy structures, provided in the manufacturing steps of integrated circuits, is considered critical for a predetermined technology, in that they allow the local density of the electrically active structures to be increased. The active structures are to be integrated on a same semiconductor substrate. In fact, these dummy structures, manufactured with semiconductor elements projecting from the semiconductor substrate, having for example a polygonal section, considerably reduce size and shape differences between electrically active structures located at the edges of very structure-dense circuit areas and those located inside the areas.

Moreover, the use of layer removal techniques by circuit-structure-morphology-sensitive tools, such as chemical mechanical polishing (CMP), further makes the insertion of dummy structures necessary since their presence also helps to reduce as much as possible any height differences between the dense areas of electrically active components.

To define a plurality of circuit structures on a semiconductor substrate, a photo-resist material mask is formed on the semiconductor substrate. The geometry of the circuit structures to be manufactured, generally defined as a layout, is etched.

A circuit layout, which does not provide the use of dummy structures at the active area level is shown in FIG. 1 as a non-limiting example. In particular, FIG. 1 shows a photo-resist material mask 1 corresponding to the geometries of the active areas of an electronic circuit to be manufactured on a semiconductor substrate. In particular, the electronic circuit comprises a first portion 3 integrating a FLASH memory matrix, and a second portion 2 integrating the corresponding circuitry.

A FLASH memory matrix comprises a plurality of electrically active structures, for example floating gate MOS transistors, while the circuitry comprises conventional MOS transistors for example. To make uniform the structures provided on the semiconductor substrate, a plurality of active areas is also provided in the layout, i.e., substrate portions delimited by a field oxide, to manufacture a plurality of dummy structures 4, as shown in FIG. 2.

The layout of these dummy structures 4 almost always occurs automatically based upon technology exploiting software tools commonly used by those skilled in the art. Although advantageous under several aspects, this approach has several drawbacks.

In fact, an excessive integration of electronic components on a same semiconductor substrate 1 requires a dedicated optimization of some process steps that are necessary to manufacture the electrically active structures forming the electronic components. Sometimes this requires the definition or "split" of a predetermined manufacture level of these structures. This implies that different photolithographic masks are used to define different circuit portions to be manufactured on a same semiconductor substrate.

For example, in the case of the circuit layout shown in FIG. 2, when the sizes of electrically active cells are reduced, the definition of the active areas of these structures of the Flash cell matrix and of the circuitry requires the use of two different photolithographic masks. This is necessary to form insulation layers having a different thickness.

Since Flash memory cell matrixes are formed by dense structures, i.e., particularly close to each other, and they are generally already drawn with dummy structures, particularly dummy cells, to take into consideration some photolithographic definition edge effects, the active areas of dummy structures 4 are provided on the semiconductor substrate 1, and when generating masks, they are associated to the electrically active structures.

Thus, when the size of electrically active structures is reduced, the need to optimize the definition of the active areas of very dense electrically active structures with respect to less dense ones is increasingly felt.

Nevertheless, when the memory matrix area portion is proportionally a negligible fraction with respect to the sizes of the whole electronic circuit, some process problems can occur with the presently available tools and equipment making it difficult to define correctly the active matrix area.

SUMMARY OF THE INVENTION

An object of the present invention is to provide a method for defining dummy structures for providing an optimum distribution thereof during the definition step with respect to electrically active structures. Having such features allows the manufacture of the electrically active structures to be more effective to overcome the limits and/or drawbacks still affecting the manufacture of devices according to prior art.

The dummy structures may be automatically generated in the layout of an integrated circuit comprising first electrically active structures and second electrically active structures to identify a first group of dummy structures adjacent to the electrically active structures and a second group of more inner dummy structures, i.e., not directly facing the electrically active structures. These two groups of dummy structures may be defined through two distinct manufacturing steps.

Advantageously, the first electrically active structures may be very dense while the second electrically active structures are less dense. The first group of dummy structures may be simultaneously defined with the second electrically active structures, while the second group of dummy structures may be simultaneously defined with the first electrically active structures.

This and other objects, advantages and features in accordance with the present invention are provided by a method for manufacturing electrically non-active structures for an electronic circuit integrated on a semiconductor substrate, with the electronic circuit comprising first and second electrically active structures. The method comprises inserting the electrically non-active structures in the electronic circuit to make uniform a surface of the semiconductor substrate.

The inserting may comprise identifying, among the electrically non-active structures, a first group of electrically non-active structures to be adjacent the first and second electrically active structures, and identifying, also among the electrically non-active structures, a second group of electrically non-active structures not adjacent to the first and second electrically active structures. The method may further comprise defining, on the semiconductor substrate, the first and second groups of electrically non-active structures through different photolithographic steps.

The first electrically active structures may be spaced close to one other, and the second electrically active structures may be spaced apart from one another, with the spacing between the second electrically active structures being greater than the spacing between the first electrically active structures.

BRIEF DESCRIPTION OF THE DRAWINGS

The features and advantages of the method according to the invention will be apparent from the following description of an embodiment thereof given by way of non-limiting examples with reference to the attached drawings. In these drawings.

DETAILED DESCRIPTION OF THE PREFERRED EMBODIMENTS

The process steps described hereinafter do not form a complete process flow for manufacturing integrated circuits. The present invention can be implemented together with the integrated circuit manufacturing techniques presently used in this field, and only those commonly used process steps necessary to understand the invention are included in the description.

The figures representing cross sections of integrated circuit portions during the manufacturing are not drawn to scale. Instead, they are drawn to show the important features of the invention. With reference to these figures, a method for manufacturing electrically non-active structures is described to optimize the definition of electrically active structures inside an electronic circuit integrated on a semiconductor substrate 5.

Figures 1, 2, 3A:
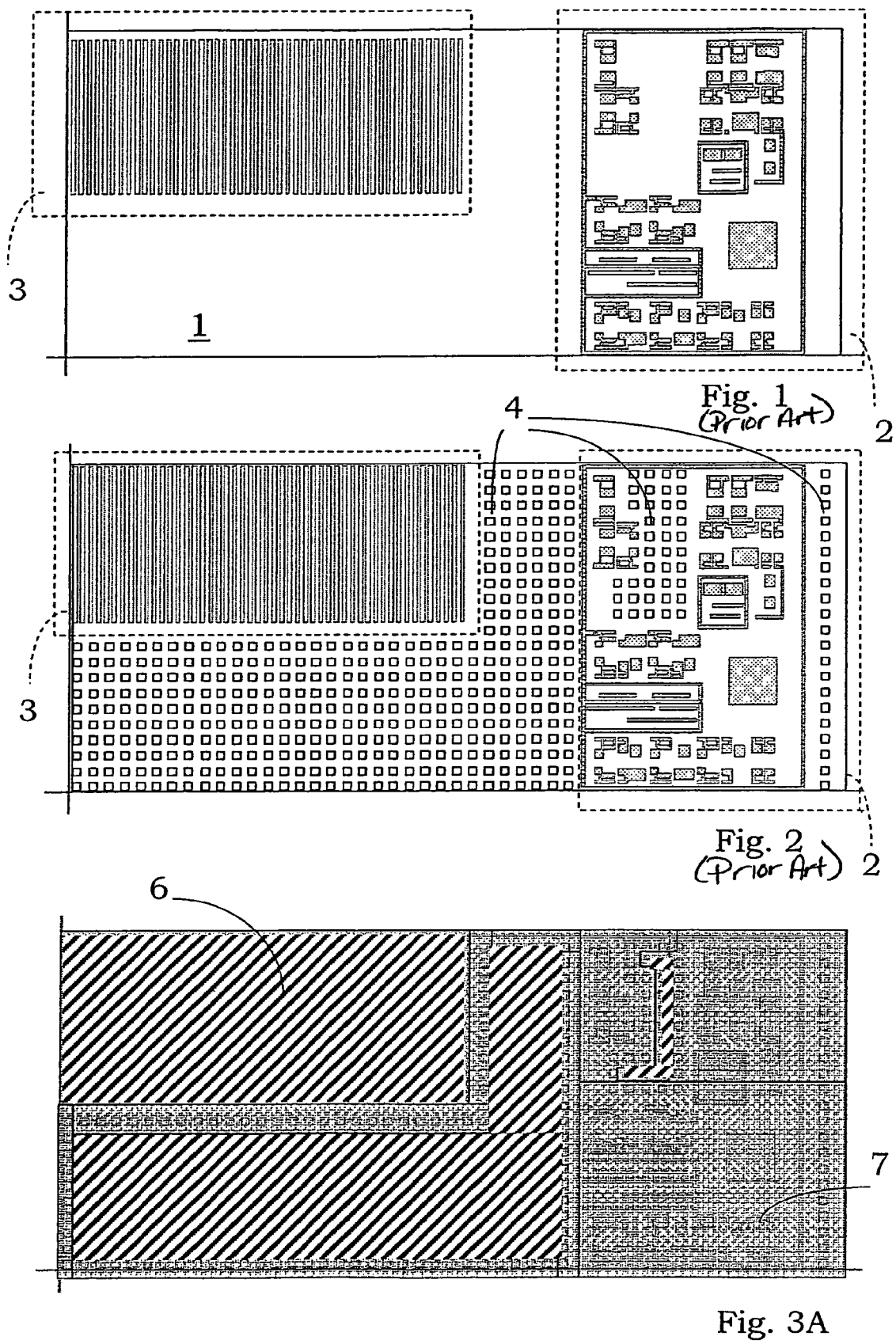
FIG. 1 shows an example at the active area level of an integrated circuit layout comprising a Flash non-volatile memory matrix portion and a circuitry portion according to the prior art.
FIG. 2 shows the layout of the circuit of FIG. 1 after generation of dummy structures according to the prior art.
FIG. 3A shows the layout of FIG. 2 wherein two different active area zones are identified and which are defined by two different photolithographic masks according to the present invention.
Figure 3B:
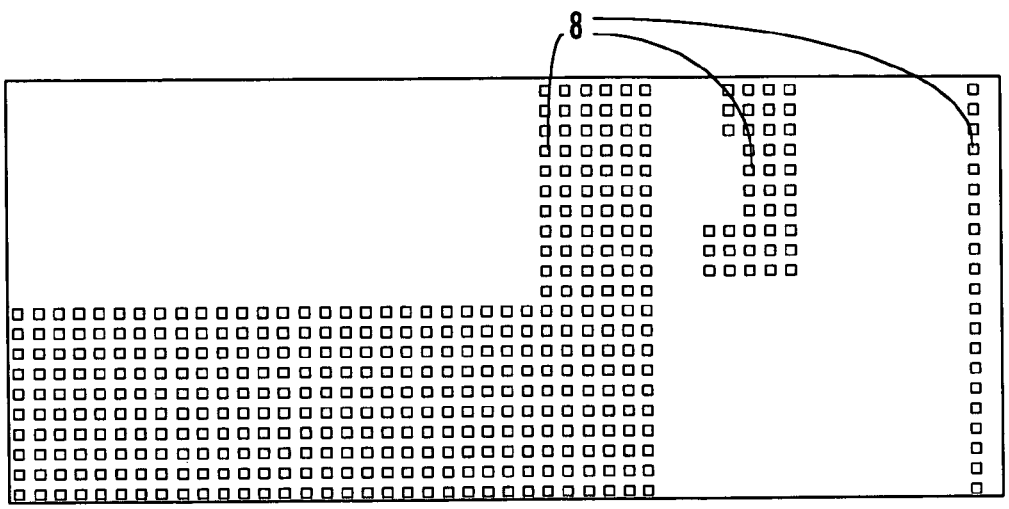
FIG. 3B shows the layout of FIG. 3A where only the dummy structures are highlighted.

In particular, and only by way of example, a method for generating active area masks for embedded Flash memories is described for 0.13 um generation. With reference to FIGS. 3A and 3B, a photolithographic mask is shown. The geometrical structures for forming the active areas are etched.

In particular, this electronic circuit comprises a first portion 6 wherein first electrically active structures are integrated, such as for example, a FLASH memory cell matrix, and a second portion 7 wherein electrically active structures are integrated, such as for example, MOS transistors, diodes, resistors or capacitors of circuitry associated with the matrix.

The first electrically active structures are very close or dense, while the second electrically active structures are not so close to each other, i.e., less dense.

As already mentioned with reference to the prior art, electrically non-active or dummy structures 8 are inserted in the integrated circuits. The step of identifying the positions wherein these electrically non-active structures 8 are manufactured in the integrated circuit usually occurs by analyzing the electrically active structures of the integrated circuit. Calculation (layer by layer of the drawing) of the density of the electrically active structures on the semiconductor substrate 5 is performed. If the density is lower than the technology set value, the automatic insertion of the dummy structures 8 is provided inside the circuit empty portions to reach a desired density.

Figure 4:
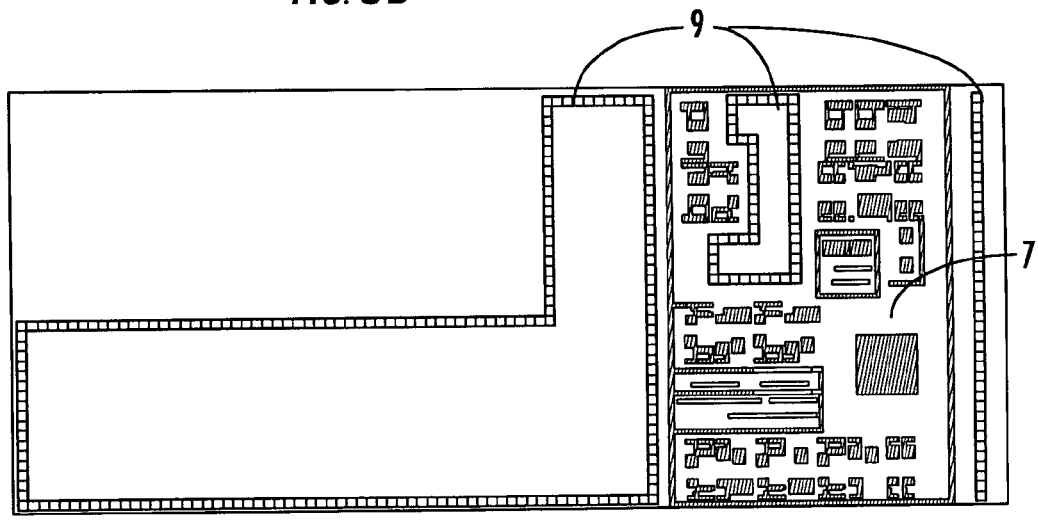
FIG. 4 shows a first layout to define a first group of active areas of the dummy structures and of the circuitry according to the present invention.
Figure 5:
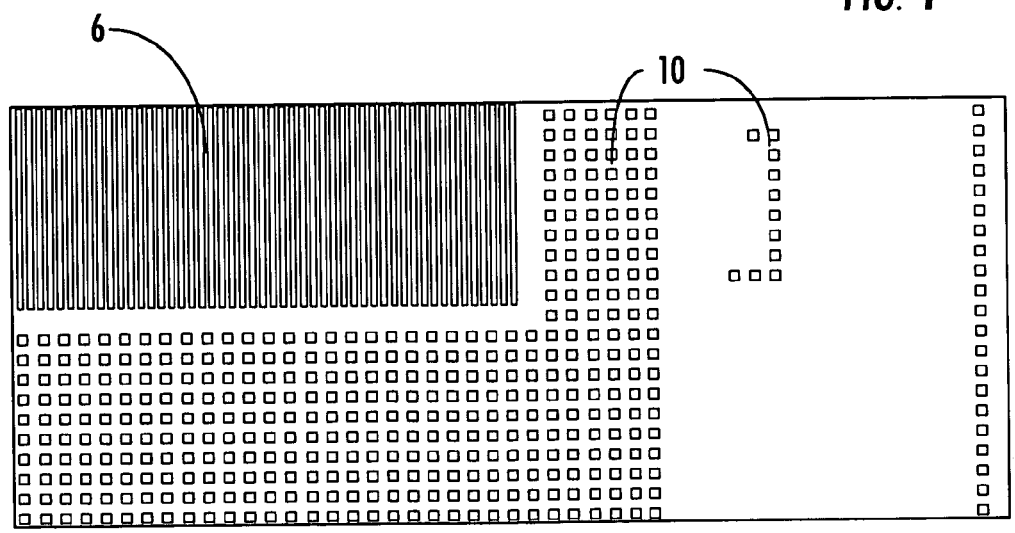
FIG. 5 shows a second layout to define a second group of active areas of the dummy structures and of the matrix according to the present invention.

In the method according to the invention, a first group 9 of dummy structures adjacent to the electrically active structures shown in FIG. 4 as well as a second group 10 of more inner dummy structures, i.e., not directly facing the electrically active structures shown in FIG. 5, are identified. According to the invention, these two groups 9, 10 of dummy structures are then defined through two different steps.

The first group 9 of dummy structures has the form of closed polygons, as shown in FIG. 4. This step of identifying the first 9 and second 10 groups of dummy structures occurs through simple boolean operations. The first group 9 of dummy structures is defined, when preparing the masks, simultaneously with the second electrically active structure 7, while the second group 10 of dummy structures is simultaneously defined with the first electrically active structures 6, through a mask shown in FIG. 5.

Therefore, in the shown example, with a particular composition of the set of masks shown in FIGS. 4 and 5, the transmittance, i.e., the enlightened areas at the photolithographic exposure time, in Flash matrix areas goes from a value much lower than 7% of the mask 1 of FIG. 1, which is not suitable at all for the correct definition of structures 3 of the "dense" type, to a value near 30%, while the same value decreases from 50% to 35% in correspondence with the circuitry area 2.

Figure 6:
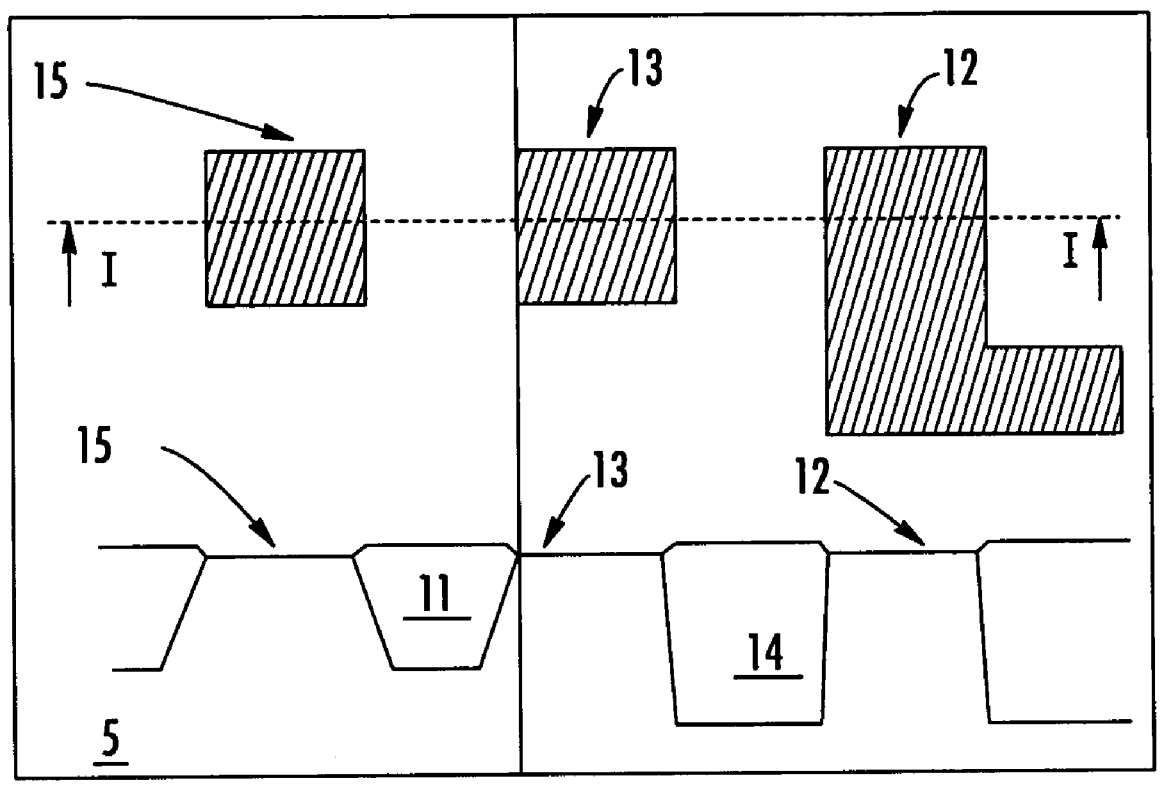
FIG. 6 shows a top view and a cross-sectional view along the line I-I of two portions of a semiconductor substrate with the dummy structures being manufactured according to the invention.

With reference to FIG. 6, a plurality of active areas is shown, obtained with the method according to the invention. In particular, on a semiconductor substrate 5, through a conventional photolithographic process using the mask of FIG. 4, active areas 12 and 13 are defined, wherein the electrically active circuitry structures 7 and the first group 9 of dummy structures are respectively integrated. Each active area 12, 13 is insulated from the adjacent area by means of an insulating layer 14 of a first thickness.

On the same semiconductor substrate 5, through a conventional photolithographic process using the mask of FIG. 5, the electrically active matrix structures 6 and the second group 10 of dummy structures are then defined in respective active areas 15. Each active area 15 is insulated from the adjacent area by an insulating layer 11 of a second thickness.

Active areas 13 adjacent to the circuitry 7 have the same structural features of the circuitry active area 12, while active areas 15 which are not adjacent to electrically active structures have the same features of the matrix active areas 6.

In the description, reference has been made to first dense electrically active structures and second less dense electrically active structures. It is, however, possible for the method according to the invention to be similarly applied to first electrically active structures having a final size different from the second electrically active structures.

In conclusion, the method according to the invention allows dummy structure 8 to be differentially defined, at the mask manufacturing and subsequent manufacturing on a semiconductor substrate level, to define most of these structures 10 at the same the definition of the matrix active area 6, but without compromising the correct manufacturing of circuitry active areas 12.

Advantageously, for the first group 9 of electrically non-active structures, those adjacent to the first 6 and second 7 electrically active structures, in the form of a closed polygon, a possible misalignment between the masks is prevented from causing a double trench in the oxide layer 11.

In the description, reference has been made to the definition of the active areas of electrically active and non-active structures. The method according to the invention is, however, applicable to different elements of the electrically active and non-active structures, whose definition requires photolithographic steps such as the definition of gate electrodes, for example.

That which is claimed is:

1. A method for manufacturing an electronic circuit comprising:
   forming first electrically active structures in a semiconductor substrate;
   forming second electrically active structures in the semiconductor substrate; and
   forming electrically non-active structures in the semiconductor substrate to make uniform a surface of the semiconductor substrate, the electrically non-active structures comprising a first group of electrically non-active structures adjacent the first and second electrically active structures and being in a form of a closed polygon.

2. A method according to claim 1, wherein the first electrically active structures are spaced close to one other, and the second electrically active structures are spaced apart from one another, with the spacing between the second electrically active structures being greater than the spacing between the first electrically active structures.

3. A method according to claim 1, wherein the electrically non-active structures further comprise a second group of electrically nonactive structures not adjacent to the first and second electrically active structures.

4. A method according to claim 3, wherein the first electrically active structures comprise a matrix of non-volatile memory cells comprising a plurality of floating gate transistors; wherein the second electrically active structures comprise a plurality of MOS transistors associated with the matrix of non-volatile memory cells; and further comprising:
   forming a first layer having a first thickness on the semiconductor substrate for insulating the first electrically active structures; and
   forming a second layer having a second thickness on the semiconductor substrate for insulating the second electrically active structures.

5. A method according to claim 1, wherein the first group of electrically non-active structures comprise semiconductor elements projecting from the semiconductor substrate.

6. A method for manufacturing an electronic circuit comprising:
   forming first electrically active structures in a semiconductor substrate, the first electrically active structures comprising a plurality of floating gate transistors;
   forming second electrically active structures in the semiconductor substrate, the second electrically active structures comprising a plurality of MOS transistors associated with the floating gate transistors; and
   forming electrically non-active structures in the semiconductor substrate to make uniform a surface of the semiconductor substrate, the electrically non-active structures comprising a first group of electrically non-active structures adjacent the first and second electrically active structures and being in a form of a closed polygon.

7. A method according to claim 6, wherein the first electrically active structures are spaced close to one other, and the second electrically active structures are spaced apart from one another, with the spacing between the second electrically active structures being greater than the spacing between the first electrically active structures.

8. A method according to claim 6, wherein the electrically non-active structures further comprise a second group of electrically non-active structures not adjacent to the first and second electrically active structures.

9. A method according to claim 6, further comprising:
   forming a first layer having a first thickness on the semiconductor substrate for insulating the first electrically active structures; and
   forming a second layer having a second thickness on the semiconductor substrate for insulating the second electrically active structures.

10. A method according to claim 6, wherein the first group of electrically non-active structures comprise semiconductor elements projecting from the semiconductor substrate.

11. An electronic circuit comprising:
    a semiconductor substrate;
    first electrically active structures in said semiconductor substrate;
    second electrically active structures in said semiconductor substrate; and
    electrically non-active structures in said semiconductor substrate to make uniform a surface thereof, said electrically non-active structures comprising a first group of electrically non-active structures adjacent said first and second electrically active structures and being in a form of a closed polygon.

12. An electronic circuit according to claim 11, wherein said first electrically active structures are spaced close to one other, and said second electrically active structures are spaced apart from one another, with the spacing between said second electrically active structures being greater than the spacing between said first electrically active structures.

13. An electronic circuit according to claim 11, wherein said electrically non-active structures further comprises a second group of electrically non-active structures not adjacent to said first and second electrically active structures.

14. An electronic circuit according to claim 11, wherein said first electrically active structures comprise a matrix of non-volatile memory cells comprising a plurality of floating gate transistors; wherein said second electrically active structures comprise a plurality of MOS transistors associated with said matrix of non-volatile memory cells; and further comprising:

a first layer having a first thickness on said semiconductor substrate for insulating said first electrically active structures; and a second layer having a second thickness on said semiconductor substrate for insulating said second electrically active structures.

* * * * *